(12) United States Patent
Tang et al.

(10) Patent No.: US 11,398,435 B2
(45) Date of Patent: Jul. 26, 2022

(54) SUBSTRATE, ALIGNMENT METHOD AND ALIGNMENT DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Runmin Tang, Beijing (CN); Jun Wang, Beijing (CN); Zhantao Wang, Beijing (CN); Junlong Wang, Beijing (CN); Xing Ren, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 72 days.

(21) Appl. No.: 16/767,445

(22) PCT Filed: Dec. 26, 2019

(86) PCT No.: PCT/CN2019/128539
§ 371 (c)(1),
(2) Date: May 27, 2020

(87) PCT Pub. No.: WO2020/140816
PCT Pub. Date: Jul. 9, 2020

(65) Prior Publication Data
US 2021/0225775 A1    Jul. 22, 2021

(30) Foreign Application Priority Data
Jan. 3, 2019 (CN) .......................... 201910004229.5

(51) Int. Cl.
*H01L 23/544* (2006.01)
*G06T 7/73* (2017.01)
(Continued)

(52) U.S. Cl.
CPC ............ *H01L 23/544* (2013.01); *G06T 7/001* (2013.01); *G06T 7/74* (2017.01); *H01L 21/681* (2013.01);
(Continued)

(58) Field of Classification Search
None
See application file for complete search history.

(56) References Cited

U.S. PATENT DOCUMENTS

2013/0201639 A1    8/2013  Ryu et al.
2017/0125271 A1*   5/2017  Minato .................. H01L 21/681
(Continued)

FOREIGN PATENT DOCUMENTS

| CN | 103034071 A | 4/2013 |
|---|---|---|
| CN | 103249260 A | 8/2013 |

(Continued)

OTHER PUBLICATIONS

First Office Action for Chinese Application No. 201910004229.5, dated Jul. 1, 2020, 9 Pages.
(Continued)

*Primary Examiner* — J. E. Schoenholtz
(74) *Attorney, Agent, or Firm* — Brooks Kushman P.C.

(57) ABSTRACT

The present disclosure provides a substrate, an alignment method and an alignment device. The substrate includes an alignment mark and an auxiliary alignment mark. A shape of the auxiliary alignment mark is different from a shape of the substrate alignment mark.

8 Claims, 1 Drawing Sheet

(51) Int. Cl.
*G06T 7/00* (2017.01)
*H01L 21/68* (2006.01)
*H01L 51/56* (2006.01)

(52) U.S. Cl.
CPC .... *H01L 51/56* (2013.01); *G06T 2207/30141* (2013.01); *G06T 2207/30204* (2013.01); *H01L 2223/54426* (2013.01)

(56) References Cited

U.S. PATENT DOCUMENTS

| | | | |
|---|---|---|---|
| 2017/0168344 A1 | 6/2017 | Song et al. | |
| 2017/0194563 A1 | 7/2017 | Li | |
| 2020/0124663 A1* | 4/2020 | Nieves | G01R 31/2891 |
| 2020/0168675 A1* | 5/2020 | Kim | H01L 27/323 |
| 2021/0223597 A1* | 7/2021 | Nakano | H01L 23/544 |

FOREIGN PATENT DOCUMENTS

| | | | | |
|---|---|---|---|---|
| CN | 103713477 A | | 4/2014 | |
| CN | 104391603 A | | 3/2015 | |
| CN | 104635432 A | | 5/2015 | |
| CN | 105549320 A | | 5/2016 | |
| CN | 105629683 A | | 6/2016 | |
| CN | 105845710 A | | 8/2016 | |
| CN | 108878401 A | | 11/2018 | |
| CN | 109742050 A | | 5/2019 | |
| GN | 101672997 A | | 3/2010 | |
| JP | 2007012698 A | | 1/2007 | |
| JP | 2020052125 A | * | 4/2020 | .............. G09F 9/30 |
| KR | 100520830 B1 | | 10/2005 | |

OTHER PUBLICATIONS

International Search Report and Written Opinion for Application No. PCT/CN2019/128539, dated Mar. 27, 2020, 11 Pages.

* cited by examiner

SUBSTRATE, ALIGNMENT METHOD AND ALIGNMENT DEVICE

CROSS-REFERENCE TO RELATED APPLICATIONS

This application is the U.S. national phase of PCT Application No. PCT/CN2019/128539 filed on Dec. 26, 2019, which claims priority to Chinese Patent Application No. 201910004229.5 filed on Jan. 3, 2019, which are incorporated herein by reference in their entireties.

TECHNICAL FIELD

The present disclosure relates to the field of display technology, and in particular to a substrate, an alignment method and an alignment device.

BACKGROUND

In the production process of organic electroluminescent light emitting diode (OLED) display product, after a substrate motherboard is cut into a plurality of substrates, it is necessary to perform electrical detection on the substrate by using an electrical detection device. When performing electrical detection, the substrate is aligned with an alignment substrate by aligning an alignment mark on the alignment substrate with an alignment mark in a wiring area of the substrate, so that pins on the alignment substrate and the pins in the wiring area are automatically pressed together. However, in the manufacturing process of the substrate, the alignment mark in the wiring area of the substrate is often contaminated, which results in low accuracy of automatic pressing.

SUMMARY

In one aspect, one embodiment of the present disclosure provides a substrate including: an alignment mark and an auxiliary alignment mark. A shape of the auxiliary alignment mark is different from a shape of the substrate alignment mark.

Further, the alignment mark is in a wiring area of the substrate; the alignment mark includes a first alignment mark and a second alignment mark, and the first alignment mark and the second alignment mark are axisymmetric with respect to a center line of the wiring area; and each of the first alignment mark and the second alignment mark is corresponding to at least one auxiliary alignment mark.

Further, positional relationship between each of the first alignment mark and the second alignment mark and the at least one auxiliary alignment mark corresponding to the each of the first alignment mark and the second alignment mark, is fixed.

Further, a distance between each of the first alignment mark and the second alignment mark and the at least one auxiliary alignment mark corresponding to the each of the first alignment mark and the second alignment mark, is fixed.

One embodiment of the present disclosure provides an alignment method for aligning the above substrate with a fixed alignment substrate, the alignment method includes:

capturing alignment marks of the alignment substrate by an image acquisition device and establishing a coordinate system on a plane where at least two alignment marks of the alignment substrate are located;

capturing the alignment mark and/or the auxiliary alignment mark of the substrate by the image acquisition device and determining coordinates of the alignment mark of the substrate in the coordinate system;

aligning the substrate with the alignment substrate according to the coordinates.

Further, the alignment substrate employs the above substrate, and the alignment substrate further includes an auxiliary alignment mark having a shape different from a shape of the alignment marks of the alignment substrate; the capturing alignment marks of the alignment substrate by an image acquisition device, includes:

capturing the alignment marks of the alignment substrate by the image acquisition device;

when capturing fails, capturing the auxiliary alignment mark of the alignment substrate by the image acquisition device, and determining positions of the alignment marks of the alignment substrate according to positional relationship between the auxiliary alignment mark of the alignment substrate and the alignment marks of the alignment substrate.

Further, the alignment substrate employs the above substrate, and the alignment substrate further includes an auxiliary alignment mark having a shape different from a shape of the alignment marks of the alignment substrate; the capturing alignment marks of the alignment substrate by an image acquisition device, includes:

capturing at least two alignment marks of the alignment substrate by the image acquisition device;

judging whether the captured at least two alignment marks of the alignment substrate meet a preset positional relationship between the at least two alignment marks of the alignment substrate;

when the captured at least two alignment marks of the alignment substrate do not meet the preset positional relationship between the at least two alignment marks of the alignment substrate, judging that there is an error in capturing, capturing the auxiliary alignment mark of the alignment substrate by the image acquisition device, and determining positions of the alignment marks of the alignment substrate according to positional relationship between the auxiliary alignment mark of the alignment substrate and the alignment marks of the alignment substrate.

Further, the capturing the alignment mark and/or the auxiliary alignment mark of the substrate by the image acquisition device and determining coordinates of the alignment mark of the substrate in the coordinate system, includes:

capturing the alignment mark of the substrate by the image acquisition device;

when capturing fails, capturing at least two of the auxiliary alignment mark of the substrate and other alignment marks of the substrate by the image acquisition device, and determining the coordinates of the alignment mark of the substrate in the coordinate system according to positional relationship between the alignment mark of the substrate and the at least two of the auxiliary alignment mark of the substrate and other alignment marks of the substrate.

Further, the capturing the alignment mark and/or the auxiliary alignment mark of the substrate by the image acquisition device and determining coordinates of the alignment mark of the substrate in the coordinate system, includes:

capturing at least two alignment marks of the substrate by the image acquisition device;

judging whether the captured at least two alignment marks of the substrate meet a preset positional relationship between the at least two alignment marks of the substrate;

when the captured at least two alignment marks of the substrate do not meet a preset positional relationship between the at least two alignment marks of the substrate, judging that there is an error in capturing, capturing the auxiliary alignment mark of the substrate by the image acquisition device, and determining the coordinates of the alignment mark of the substrate in the coordinate system according to positional relationship between the alignment mark of the substrate and at least two of the auxiliary alignment mark of the substrate and successfully captured alignment marks of the substrate.

Further, the alignment mark of the substrate includes a first substrate alignment mark and a second substrate alignment mark, the first substrate alignment mark and the second substrate alignment mark are axisymmetric with respect to a center line of a wiring area of the substrate; the alignment mark of the alignment substrate includes a first alignment substrate alignment mark corresponding to the first substrate alignment mark, and a second alignment substrate alignment mark corresponding to the second substrate alignment mark;

wherein the establishing a coordinate system on a plane where at least two alignment marks of the alignment substrate are located, includes: establishing the coordinate system on a plane where the first alignment substrate alignment mark and the second alignment substrate alignment mark are located, and calculating first coordinates of the first alignment substrate alignment mark in the coordinate system and second coordinates of the second alignment substrate alignment mark in the coordinate system;

wherein the determining coordinates of the alignment mark of the substrate in the coordinate system, includes: determining third coordinates of the first substrate alignment mark in the coordinate system and fourth coordinates of the second substrate alignment mark in the coordinate system;

wherein the aligning the substrate with the alignment substrate according to coordinates, includes: aligning the substrate with the alignment substrate according to the first coordinates, the second coordinates, the third coordinates and the fourth coordinates.

Further, the aligning the substrate with the alignment substrate according to the first coordinates, the second coordinates, the third coordinates and the fourth coordinates, includes:

rotating the substrate so that $(Y1-Y5)=(Y2-Y6)$;

moving the substrate in a Y-axis direction by a distance of $(Y1-Y5)$ so that $(Y1-Y5)=(Y2-Y6)=0$;

moving the substrate in an X-axis direction by a distance of $(X1+X2-X5-X6)/2$; wherein, when a calculation result of $(X1+X2-X5-X6)/2$ is a positive value, the substrate is moved towards a positive direction of the X axis by a distance of an absolute value of $(X1+X2-X5-X6)/2$; when the calculation result of $(X1+X2-X5-X6)/2$ is a negative value, the substrate is moved towards a negative direction of the X axis by a distance of an absolute value of $(X1+X2-X5-X6)/2$;

wherein the first coordinates are $(X5, Y5)$, the second coordinates are $(X6, Y6)$, the third coordinates are $(X1, Y1)$, and the fourth coordinates are $(X2, Y2)$.

One embodiment of the present disclosure provides an alignment device for performing the above alignment method, the alignment device includes:

a processor configured to capture alignment marks of an alignment substrate by an image acquisition device and establish a coordinate system on a plane where at least two alignment marks of the alignment substrate are located;

a calculator configured to capture an alignment mark and/or an auxiliary alignment mark of a substrate by the image acquisition device, and determine coordinates of the alignment mark of the substrate in the coordinate system;

an aligner configured to align the substrate with the alignment substrate according to the coordinates.

One embodiment of the present disclosure provides an alignment device including: a memory, a processor, and a computer program stored on the memory and executable on the processor; wherein the computer program is executed by the processor to implement steps of the above alignment method.

One embodiment of the present disclosure provides a computer readable storage medium including a computer program stored thereon; wherein the computer program is executed by a processor to implement steps of the above alignment method.

Figure 1:
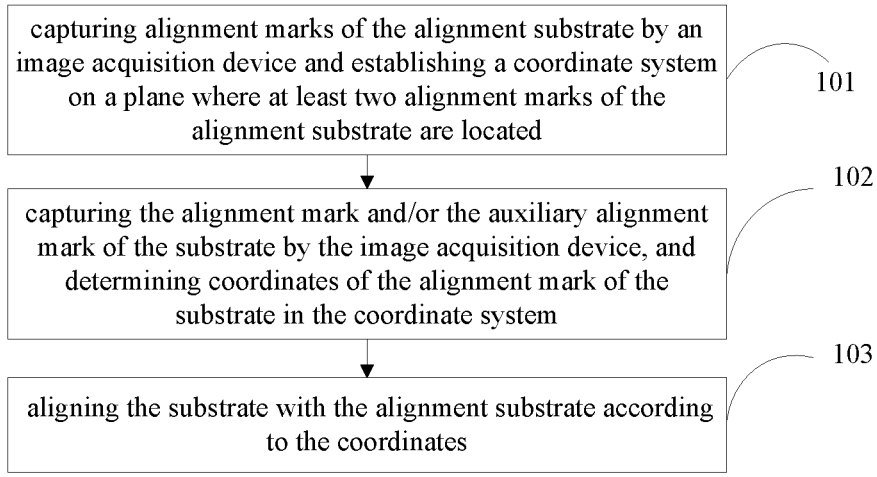
FIG. 1 is a schematic flowchart of an alignment method according to an embodiment of the present disclosure.

REFERENCE NUMERAL 1 electrical detection circuit board
2 wiring area
3 circuit board alignment mark
4 display substrate alignment mark
5 auxiliary alignment mark

DETAILED DESCRIPTION

In order to make the technical problems to be solved, the technical solutions and the advantages of embodiments of the present disclosure more apparent, the present disclosure will be described hereinafter in a clear and complete manner in conjunction with the drawings and embodiments.

Embodiments of the present disclosure provide a substrate, an alignment method and an alignment device, which can ensure that the substrate is correctly aligned with an alignment substrate.

One embodiment of the present disclosure provides a substrate provided with a substrate alignment mark. The substrate is further provided with an auxiliary alignment mark. A shape of the auxiliary alignment mark is different from a shape of the substrate alignment mark.

In this embodiment, the auxiliary alignment mark having a shape different from the shape of the substrate alignment mark, is added on the substrate. In this way, when the substrate alignment mark is contaminated, resulting in failure or error in capturing the substrate alignment mark, the auxiliary alignment mark can be captured. Then, a position of the substrate alignment mark is calculated according to positional relationship between the auxiliary alignment mark and the substrate alignment mark, thereby ensuring that the substrate is correctly aligned with an alignment substrate.

Further, the substrate alignment mark may be in a wiring area of the substrate. The substrate alignment mark includes a first substrate alignment mark and a second substrate alignment mark. The first substrate alignment mark and the second substrate alignment mark are axisymmetric with respect to a center line of the wiring area. Each substrate alignment mark is corresponding to at least one auxiliary alignment mark. For convenience of alignment, the first substrate alignment mark and the second substrate alignment mark are axisymmetric with respect to the center line of the wiring area.

Further, the auxiliary alignment mark includes a first auxiliary alignment mark and a second auxiliary alignment mark. The first auxiliary alignment mark and the second auxiliary alignment mark are axisymmetric with respect to the center line of the wiring area. For convenience of alignment, the auxiliary alignment mark includes the first auxiliary alignment mark and the second auxiliary alignment mark that are axisymmetric with respect to the center line of the wiring area. Positional relationship among the first auxiliary alignment mark, the second auxiliary alignment mark and the substrate alignment mark is fixed. The position of the substrate alignment mark can be determined according to a position of the first auxiliary alignment mark or the second auxiliary alignment mark.

One embodiment of the present disclosure further provides an alignment method for aligning the substrate with an alignment substrate. The alignment substrate is provided with alignment marks. As shown in FIG. 1, the alignment method includes:

Step 101: capturing alignment marks of the alignment substrate by an image acquisition device and establishing a coordinate system on a plane where at least two alignment marks of the alignment substrate are located;

Step 102: capturing the alignment mark and/or the auxiliary alignment mark of the substrate by the image acquisition device, and determining coordinates of the alignment mark of the substrate in the coordinate system;

Step 103: aligning the substrate with the alignment substrate according to the coordinates.

In this embodiment, the auxiliary alignment mark having a shape different from the shape of the substrate alignment mark, is added on the substrate. In this way, when the substrate alignment mark is contaminated, resulting in failure or error in obtaining the substrate alignment mark, the auxiliary alignment mark can be captured. Then, a position of the substrate alignment mark is calculated according to positional relationship between the auxiliary alignment mark and the substrate alignment mark, thereby ensuring that the substrate is correctly aligned with an alignment substrate.

In some embodiments, an auxiliary alignment mark may be provided on the fixed alignment substrate. That is, the alignment substrate further includes an auxiliary alignment mark having a shape different from a shape of the alignment mark of the alignment substrate. In this way, when capturing the alignment marks of the alignment substrate and establishing a coordinate system, if capturing the alignment marks of the alignment substrate fails or is wrong, the auxiliary alignment mark of the alignment substrate may be captured, and then positions of the alignment marks of the alignment substrate can be determined according to the auxiliary alignment mark of the alignment substrate.

In a specific embodiment, capturing the alignment marks of the alignment substrate by an image acquisition device, includes:

capturing the alignment marks of the alignment substrate by the image acquisition device;

when capturing fails, capturing the auxiliary alignment mark of the alignment substrate by the image acquisition device, and determining positions of the alignment marks of the alignment substrate according to the positional relationship between the auxiliary alignment mark of the alignment substrate and the alignment marks of the alignment substrate.

The alignment substrate is provided with at least one auxiliary alignment mark corresponding to each alignment mark of the alignment substrate. After the preparation of the alignment substrate is completed, the positional relationship between each of the alignment marks and the corresponding auxiliary alignment mark is definite. For example, a distance between the alignment mark and its corresponding auxiliary alignment mark is fixed. In the coordinate system established based on at least two alignment marks of the alignment substrate, a distance between the alignment mark and its corresponding auxiliary alignment mark on the x-axis is fixed, and a distance between the alignment mark and its corresponding auxiliary alignment mark on the y-axis is also fixed. Therefore, when one of the alignment marks fails to be captured, any auxiliary alignment mark corresponding to the one of the alignment marks can be captured, and then a position of the one of the alignment marks can be determined according to a position of the auxiliary alignment mark corresponding to the one of the alignment marks.

In addition, after the alignment mark is captured, it is also necessary to determine whether the captured alignment mark is correct. Specifically, whether the captured alignment mark is correct may be determined according to the positional relationship between the alignment marks. After the preparation of the alignment substrate is completed, the positional relationship between any two alignment marks is fixed. For example, a distance between any two alignment marks is fixed, and whether the captured alignment mark is correct may be determined according to the distance between any two alignment marks.

In a specific embodiment, the capturing the alignment marks of the alignment substrate by an image acquisition device, includes:

capturing at least two alignment marks of the alignment substrate by the image acquisition device;

judging whether the captured at least two alignment marks of the alignment substrate meet a preset positional relationship between the at least two alignment marks;

when the captured at least two alignment marks of the alignment substrate do not meet the preset positional relationship between the at least two alignment marks, judging that a capturing error occurs, capturing an auxiliary alignment mark of the alignment substrate by the image acquisition device, and determining positions of the alignment marks of the alignment substrate according to the positional relationship between the auxiliary alignment mark of the alignment substrate and the alignment marks of the alignment substrate.

Specifically, after the two alignment marks of the alignment substrate are captured, it is judged whether the distance between the two alignment marks meets a distance acquired in advance between two alignment marks. If the distance between the two alignment marks does not meet the distance acquired in advance between two alignment marks, it is judged that a capturing error occurs, and an auxiliary alignment mark of the alignment substrate is needed to be captured. One or more auxiliary alignment marks are needed to be captured. The positions of the two alignment marks of the alignment substrate can be directly determined according to position information of one or more auxiliary alignment marks as well as the positional relationship between the auxiliary alignment mark of the alignment substrate and the two alignment marks of the alignment substrate. Since the distance between the alignment mark and the auxiliary alignment mark is also fixed after preparation of the alignment substrate is completed, after capturing an auxiliary alignment mark, a distance between the auxiliary alignment mark and the alignment mark can be used to determine which of the two alignment marks previously captured has an error. If there is an error in the capture of only one alignment mark, the position of the one alignment mark can be re-determined by using the position of the auxiliary alignment mark. If there is an error in the capture of the two alignment marks, it is necessary to re-determine the positions of the two alignment marks by using the position of the auxiliary alignment mark.

In the process of aligning the substrate, the alignment substrate is fixed, and the substrate is moved. Thus, when one of the alignment marks of the substrate fails to be captured, it is necessary to use at least two known position points and positional relationship (such as distance) between the known position points and the alignment mark to determine the position of the alignment mark that fails to be captured. Specifically, position information of one alignment mark that fails to be captured, can be determined according to position information of at least two of the auxiliary alignment marks and other successfully captured alignment marks.

In a specific embodiment, the capturing the alignment mark and/or the auxiliary alignment mark of the substrate by the image acquisition device, and determining coordinates of the alignment mark of the substrate in the coordinate system, includes:

capturing the alignment mark of the substrate by the image acquisition device;

when capturing fails, capturing at least two of the auxiliary alignment mark and other alignment marks of the substrate by the image acquisition device, and determining coordinates of the alignment mark of the substrate in the coordinate system according to positional relationship between the alignment mark and at least two of the auxiliary alignment mark and other alignment marks of the substrate.

The at least two of the auxiliary alignment mark and other alignment marks may include two auxiliary alignment marks, or two other alignment marks, or one auxiliary alignment mark as well as one other alignment mark. It is worth noting that the above auxiliary alignment mark and other alignment marks are all successfully captured alignment marks.

In addition, after the alignment mark of the substrate is captured, it is further necessary to determine whether the captured alignment mark is correct. Specifically, whether the captured alignment mark is correct may be determined according to the positional relationship between the alignment marks. After the preparation of the substrate is completed, the positional relationship between any two alignment marks is fixed. For example, a distance between any two alignment marks is fixed, and whether the captured alignment mark is correct may be determined according to the distance between any two alignment marks.

In a specific embodiment, the capturing the alignment mark and/or the auxiliary alignment mark of the substrate by the image acquisition device, and determining coordinates of the alignment mark of the substrate in the coordinate system, includes:

capturing at least two alignment marks of the substrate by the image acquisition device;

judging whether the captured at least two alignment marks of the substrate meet a preset positional relationship between the at least two alignment marks;

when the captured at least two alignment marks of the substrate do not meet the preset positional relationship between the at least two alignment marks, judging that a capturing error occurs, capturing an auxiliary alignment mark of the substrate by the image acquisition device, and determining coordinates of the alignment mark of the substrate in the coordinate system according to positional relationship between the alignment mark of the substrate and at least two of the auxiliary alignment mark of the substrate and successfully captured alignment marks.

Specifically, after two alignment marks of the substrate are captured, it is judged whether the distance between the two alignment marks meets a distance acquired in advance between two alignment marks. If the distance between the two alignment marks does not meet the distance acquired in advance between two alignment marks, it is judged that a capturing error occurs, and an auxiliary alignment mark of the substrate is needed to be captured.

At least two auxiliary alignment marks may be captured. The positions of the two alignment marks of the substrate can be directly determined according to position information of the at least two auxiliary alignment marks as well as the positional relationship between the auxiliary alignment mark of the substrate and the two alignment marks of the substrate. Since the distance between the alignment mark and the auxiliary alignment mark is also fixed after preparation of the substrate is completed, after capturing at least two auxiliary alignment marks, a distance between the auxiliary alignment mark and the alignment mark can be used to determine which of the two alignment marks previously captured has an error. If there is an error in the capture of only one alignment mark, the position of the one alignment mark can be re-determined by using the positions of the at least two auxiliary alignment marks. If there is an error in the capture of the two alignment marks, it is necessary to re-determine the positions of the two alignment marks by using the position of the at least two auxiliary alignment marks. In addition, if at least one alignment mark has been successfully captured in advance, only one auxiliary alignment mark may be captured. Then, a position of the alignment mark that fails to be captured, can be determined according to the position information of the auxiliary alignment mark, the positional relationship between the auxiliary alignment mark and the alignment mark of the substrate, and the position information of the one alignment mark that has been successfully captured as well as positional relationship between the one alignment mark that has been successfully captured and the alignment mark that fails to be captured.

In a specific embodiment, the substrate alignment mark includes a first substrate alignment mark and a second substrate alignment mark. The first substrate alignment mark and the second substrate alignment mark are axisymmetric with respect to a center line of the wiring area. The alignment substrate alignment mark includes a first alignment substrate alignment mark corresponding to the first substrate alignment mark, and a second alignment substrate alignment mark corresponding to the second substrate alignment mark. When no capture failure or capture error occurs and then the auxiliary alignment mark is not needed, the alignment method specifically includes:

capturing the first alignment substrate alignment mark by the image acquisition device, and establishing a first coordinate system on a plane where the first alignment substrate alignment mark is;

capturing the first substrate alignment mark by the image acquisition device, and determining first coordinates of the first substrate alignment mark in the first coordinate system;

capturing the second alignment substrate alignment mark by the image acquisition device, and establishing a second coordinate system on a plane where the second alignment substrate alignment mark is;

capturing the second substrate alignment mark by the image acquisition device, and determining second coordinates of the second substrate alignment mark in the second coordinate system;

aligning the substrate with the alignment substrate according to the first coordinates and the second coordinates.

When performing the alignment, the substrate is first rotated to enable Y1=Y2. Then, the substrate is moved by Y1 along the Y direction so that Y1=Y2=0. And then, the substrate is moved by a distance of (X1+X2)/2 along the X direction, thereby completing the alignment. Finally, the alignment and the alignment substrate can be pressed together to perform lighting test. The first coordinates are (X1, Y1), and the second coordinates are (X2, Y2).

In a specific embodiment, the substrate alignment mark includes a first substrate alignment mark and a second substrate alignment mark. The first substrate alignment mark and the second substrate alignment mark are axisymmetric with respect to a center line of the wiring area of the substrate. The alignment substrate alignment mark includes a first alignment substrate alignment mark corresponding to the first substrate alignment mark, and a second alignment substrate alignment mark corresponding to the second substrate alignment mark. The establishing a coordinate system on a plane where at least two alignment marks of the alignment substrate are, includes:

establishing the coordinate system on a plane where the first alignment substrate alignment mark and the second alignment substrate alignment mark are located, and calculating first coordinates of the first alignment substrate alignment mark in the coordinate system and second coordinates of the second alignment substrate alignment mark in the coordinate system.

The determining coordinates of the alignment mark of the substrate in the coordinate system, includes: determining third coordinates of the first substrate alignment mark in the coordinate system and fourth coordinates of the second substrate alignment mark in the coordinate system.

The aligning the substrate with the alignment substrate according to coordinates, includes: aligning the substrate with the alignment substrate according to the first coordinates, the second coordinates, the third coordinates and the fourth coordinates.

Further, aligning the substrate with the alignment substrate according to the first coordinates, the second coordinates, the third coordinates and the fourth coordinates, includes:

rotating the substrate so that (Y1−Y5)=(Y2−Y6);

moving the substrate in the Y-axis direction by a distance of (Y1−Y5) so that (Y1−Y5)=(Y2−Y6)=0;

moving the substrate in the X-axis direction by a distance of (X1+X2−X5−X6)/2. According to different values of X1, X2, X5 and X6, a calculation result of (X1+X2−X5−X6)/2 may be a positive value or a negative value. When the calculation result of (X1+X2−X5−X6)/2 is a positive value, the substrate is moved towards the positive direction of the X axis by a distance of an absolute value of (X1+X2−X5−X6)/2. When the calculation result of (X1+X2−X5−X6)/2 is a negative value, the substrate is moved towards the negative direction of the X axis by a distance of an absolute value of (X1+X2−X5−X6)/2.

The first coordinates are (X5, Y5), the second coordinates are (X6, Y6), the third coordinates are (X1, Y1), and the fourth coordinates are (X2, Y2).

With reference to the drawings and specific embodiments, the alignment method of the present disclosure will be further introduced with an example, in which the substrate is a display substrate, the alignment substrate is an electrical detection circuit board, the display substrate is provided with an auxiliary alignment mark, and the electrical detection circuit board is not provided with an auxiliary alignment mark.

In this embodiment, the electrical detection circuit board 1 is provided with a pair of circuit board alignment marks 3. The pair of circuit board alignment marks 3 are axisymmetric with respect to a center line of the electrical detection circuit board 1. Specifically, the circuit board alignment mark 3 may have a T-shape. A pair of display substrate alignment marks 4 are provided in a wiring area 2 of the display substrate. The pair of display substrate alignment marks 4 are axisymmetric with respect to a center line of the wiring area 2. The display substrate alignment mark 4 may have a T-shape. A pair of auxiliary alignment marks 5 are further provided in the wiring area 2. In order to distinguish the auxiliary alignment mark 5 from the display substrate alignment mark 4, the shape of the auxiliary alignment mark 5 is different from the shape of the display substrate alignment mark 4, and specifically may be a triangle.

According to the alignment method in the related art, an image acquisition device A captures one of the circuit board alignment marks 3, thereby establishing a coordinate system A. The image acquisition device A captures the display substrate alignment mark 4 corresponding to the one of the circuit board alignment marks 3, and coordinates (X1, Y1) of the display substrate alignment mark 4 in the coordinate system A are calculated. An image acquisition device B captures the other one of the circuit board alignment marks 3, thereby establishing a coordinate system B. The image acquisition device B captures the display substrate alignment mark 4 corresponding to the other one of the circuit board alignment marks 3, and coordinates (X2, Y2) of the display substrate alignment mark 4 in the coordinate system B are calculated. When establishing the coordinate system based on the position of the circuit board alignment mark 3, the circuit board alignment mark 3 is located in the plane where the coordinate system is located, and the plane where the coordinate system is located is parallel to the plane where the wiring area is located, and the coordinates of the display substrate alignment mark 4 in the coordinate system are coordinates of a center point of an orthographic projection of the display substrate alignment mark 4 to the plane of the coordinate system in the coordinate system.

When performing the alignment, the display substrate is first rotated so that Y1=Y2. Then, the display substrate is moved in the Y direction by a distance of Y1, so that Y1=Y2=0. And then, the display substrate is moved in the X direction by a distance of (X1+X2)/2, thereby completing the alignment. Finally, the display substrate and the electrical detection circuit board can be pressed together to perform lighting test.

In the related art, if the display substrate alignment mark 4 is contaminated, when the display substrate alignment mark 4 fails to be captured, the device alarms, and users need to manually release the alarm, which will affect the device capacity. If the display substrate alignment mark 4 is captured incorrectly, the device is unable to identify the incorrectly captured display substrate alignment mark 4, resulting in abnormal products when lighting, which will affect the device yield.

In this embodiment, the two circuit board alignment marks 3 are captured by the image acquisition device, and a coordinate system C is established based on positions of the two circuit board alignment marks 3. The two circuit board alignment marks 3 are located in a plane where the coordinate system C is located. The plane where the coordinate system C is located is parallel to a plane where the wiring area is located. The coordinates of the display substrate alignment mark 4 in the coordinate system C are coordinates of a center point of an orthographic projection of the display substrate alignment mark 4 to the plane of the coordinate system C in the coordinate system.

Coordinates of center points of the two circuit board alignment marks 3 in the coordinate system C are calculated as (X5, Y5), (X6, Y6), respectively.

Then, the image acquisition device captures a pair of display substrate alignment marks 4 corresponding to the circuit board alignment marks 3, and coordinates of the pair of display substrate alignment marks 4 in the coordinate system C are calculated as (X1, Y1), (X2, Y2), respectively. It is judged whether positional relationship between (X1, Y1) and (X2, Y2) meets a preset positional relationship between the two display substrate alignment marks 4. If the positional relationship between (X1, Y1) and (X2, Y2) meets the preset positional relationship between the two display substrate alignment marks 4, it indicates that the display substrate alignment marks 4 are successfully captured. If the positional relationship between (X1, Y1) and (X2, Y2) does not meet the preset positional relationship between the two display substrate alignment marks 4, it indicates that the display substrate alignment marks 4 are captured incorrectly. For example, a distance between the two display substrate alignment marks 4 is calculated according to (X1, Y1) and (X2, Y2); if the calculated distance meets a preset distance, it indicates that capturing succeeds; if the calculated distance does not meet a preset distance, it indicates that capturing fails.

If the display substrate alignment mark 4 is successfully captured, when performing the alignment, the display substrate is first rotated so that (Y1−Y5)=(Y2−Y6). Then, the display substrate is moved in the Y-axis direction by a distance of (Y1−Y5) so that (Y1−Y5)=(Y2−Y6)=0. And then, the display substrate is moved in the X-axis direction by a distance of (X1+X2−X5−X6)/2, thereby completing the alignment. Finally, the display substrate and the electrical detection circuit board can be pressed together to perform lighting test.

Figure 2:
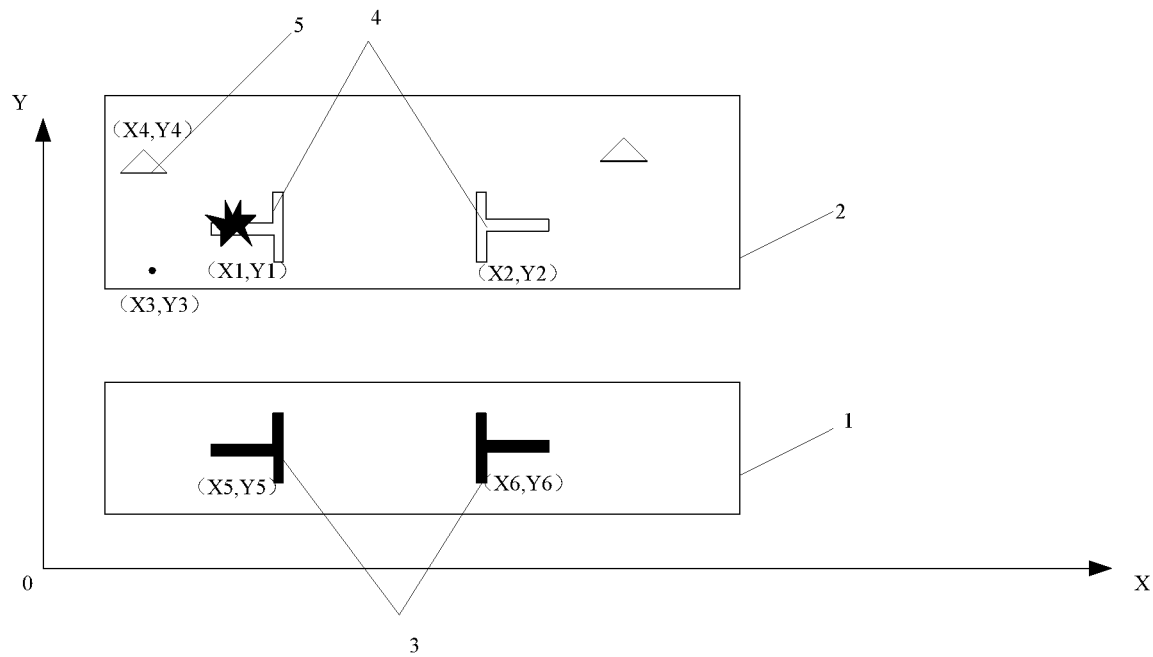
FIG. 2 is a schematic diagram of an auxiliary alignment mark provided in a wiring area according to an embodiment of the present disclosure.

As shown in FIG. 2, when one display substrate alignment mark 4 (X1, Y1) is contaminated, if capturing of the display substrate alignment mark 4 fails, one of the auxiliary alignment marks 5 and another display substrate alignment mark 4 (X2, Y2) are captured. Coordinates of the auxiliary alignment mark 5 are calculated as (X4, Y4). Correct (X1, Y1) can be calculated according to preset positional relationship between the auxiliary alignment mark 5 and the display substrate alignment mark 4 (X1, Y1) as well as positional relationship between another display substrate alignment mark 4 (X2, Y2) and the display substrate alignment mark 4 (X1, Y1). At this point, the device does not need to alarm. After preparation of the display substrate is completed, the positional relationship between the auxiliary alignment mark 5 and the display substrate alignment mark 4 is fixed, and the positional relationship may include the distance between the auxiliary alignment mark 5 and the display substrate alignment mark 4. According to the positional relationship and the coordinates of the auxiliary alignment mark 5 as well as the positional relationship between the other display substrate alignment mark 4 (X2, Y2) and the display substrate alignment mark 4 (X1, Y1), the coordinates (X1, Y1) of the display substrate alignment mark 4 can be determined.

If capturing of the two display substrate alignment marks 4 fails or the two display substrate alignment marks 4 are contaminated, coordinates of at least two auxiliary alignment marks 5 as well as positional relationship between the two display substrate alignment marks 4 and the at least two auxiliary alignment marks 5 can be obtained. According to the coordinates of at least two auxiliary alignment marks 5 as well as the positional relationship between the two display substrate alignment marks 4 and the at least two auxiliary alignment marks 5, coordinates (X1, Y1) and (X2, Y2) of the two display substrate alignment marks 4 are determined.

In order to avoid the failure of capturing the auxiliary alignment mark 5, when coordinates of the captured auxiliary alignment mark 5 are (X3, Y3) and the coordinates of one display substrate alignment mark 4 are (X2, Y2), a relative distance between (X3,Y3) and (X2,Y2) is calculated. If the calculation result does not meet the preset positional relationship between the auxiliary alignment mark 5 and the display substrate alignment mark 4, it indicates that there is a failure to capture the auxiliary alignment mark 5, and another auxiliary alignment mark 5 is automatically captured. For example, the auxiliary alignment mark 5 with coordinates (X4, Y4) is automatically captured. A relative distance between (X4, Y4) and (X2, Y2) is calculated. If the calculation result meets the preset positional relationship between the auxiliary alignment mark 5 and the display substrate alignment mark 4, it indicates that the auxiliary alignment mark 5 is successfully captured. After verifying that (X4, Y4) are correct coordinates of the auxiliary alignment mark 5, correct (X1, Y1) are calculated according to the preset positional relationship between the auxiliary alignment mark 5 and the display substrate alignment mark 4. If (X4, Y4) are still not the correct coordinates of the auxiliary alignment mark 5, then the image acquisition device continues to capture another auxiliary alignment mark 5, and so on.

After calculating the correct (X1, Y1) and (X2, Y2), the alignment can be performed according to (X1, Y1) and (X2, Y2). First, the display substrate is rotated so that (Y1−Y5)=(Y2−Y6). Then, the display substrate is moved in the Y-axis direction by a distance of (Y1−Y5) so that (Y1−Y5)=(Y2−Y6)=0. And then, the display substrate is moved in the X-axis direction by a distance of (X1+X2−X5−X6)/2, thereby completing the alignment. Finally, the display substrate and the electrical detection circuit board can be pressed together to perform lighting test. The calculation result of (X1+X2−X5−X6)/2 is a positive value or a negative value. When the calculation result of (X1+X2−X5−X6)/2 is a positive value, the display substrate is moved towards the positive direction of the X axis by a distance of an absolute value of (X1+X2−X5−X6)/2. When the calculation result of (X1+X2−X5−X6)/2 is a negative value, the display substrate is moved towards the negative direction of the X axis by a distance of an absolute value of (X1+X2−X5−X6)/2.

In the technical solution of one embodiment, an auxiliary alignment mark may also be provided on the electrical detection circuit board. That is, the electrical detection circuit board further includes an auxiliary alignment mark having a shape different from a shape of the alignment mark of the electrical detection circuit board. In this way, when capturing the alignment marks of the electrical detection circuit board and establishing a coordinate system, if capturing the alignment marks of the electrical detection circuit board fails or is wrong, the auxiliary alignment mark of the electrical detection circuit board may be captured, and then positions of the alignment marks of the electrical detection circuit board can be determined according to the auxiliary alignment mark of the electrical detection circuit board.

One embodiment of the present disclosure further provides an electrical detection method. After the substrate is aligned with the alignment substrate according to the alignment method as described above, the electrical detection circuit board is pressed onto a lead region of the substrate, and then electrical detection is performed on the substrate.

Figure 3:
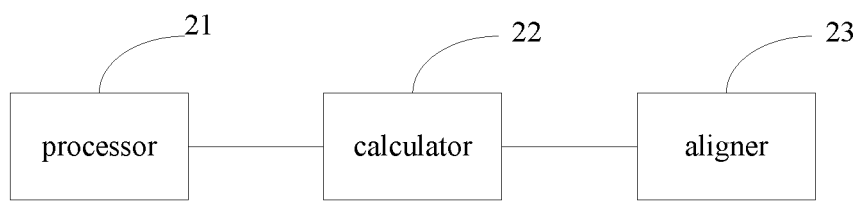
FIG. 3 is a block diagram of an alignment device according to an embodiment of the present disclosure.

One embodiment of the present disclosure further provides an alignment device for aligning the above substrate with the alignment substrate. The alignment substrate is provided with alignment substrate alignment marks. As shown in FIG. 3, the alignment device includes:

a processor 21 configured to capture the alignment marks of the alignment substrate by an image acquisition device and establish a coordinate system on a plane where at least two alignment marks of the alignment substrate are;

a calculator 22 configured to capture an alignment mark and/or an auxiliary alignment mark of the substrate by the image acquisition device, and determine coordinates of the alignment mark of the substrate in the coordinate system;

an aligner 23 configured to align the substrate with the alignment substrate according to the coordinates.

In this embodiment, the auxiliary alignment mark having a shape different from the shape of the substrate alignment mark, is added on the substrate. In this way, when the substrate alignment mark is contaminated, resulting in failure or error in obtaining the substrate alignment mark, the auxiliary alignment mark can be captured. Then, a position of the substrate alignment mark is calculated according to positional relationship between the auxiliary alignment mark and the substrate alignment mark, thereby ensuring that the substrate is correctly aligned with an alignment substrate.

In a specific embodiment, the alignment substrate further includes an auxiliary alignment mark having a shape different from the shape of the alignment substrate alignment mark. The processor 21 is further configured to capture at least two alignment marks of the alignment substrate by the image acquisition device; judge whether the captured at least two alignment marks of the alignment substrate meet a preset positional relationship between the at least two alignment marks; when the captured at least two alignment marks of the alignment substrate do not meet the preset positional relationship between the at least two alignment marks, judge that a capturing error occurs, capture an auxiliary alignment mark of the alignment substrate by the image acquisition device, and determine positions of the alignment marks of the alignment substrate according to the positional relationship between the auxiliary alignment mark of the alignment substrate and the alignment marks of the alignment substrate.

In a specific embodiment, the calculator 22 is further configured to capture the alignment mark of the substrate by the image acquisition device; when capturing fails, capture at least two of the auxiliary alignment mark and other alignment marks of the substrate by the image acquisition device, and determine coordinates of the alignment mark of the substrate in the coordinate system according to positional relationship between the alignment mark and at least two of the auxiliary alignment mark and other alignment marks of the substrate.

In a specific embodiment, the calculator 22 is further configured to capture at least two alignment marks of the substrate by the image acquisition device; judge whether the captured at least two alignment marks of the substrate meet a preset positional relationship between the at least two alignment marks; when the captured at least two alignment marks of the substrate do not meet the preset positional relationship between the at least two alignment marks, judge that a capturing error occurs, capture an auxiliary alignment mark of the substrate by the image acquisition device, and determine coordinates of the alignment mark of the substrate in the coordinate system according to positional relationship between the alignment mark of the substrate and at least two of the auxiliary alignment mark of the substrate and successfully captured alignment marks.

In a specific embodiment, the substrate alignment mark includes a first substrate alignment mark and a second substrate alignment mark. The first substrate alignment mark and the second substrate alignment mark are axisymmetric with respect to a center line of the wiring area of the substrate. The alignment substrate alignment mark includes a first alignment substrate alignment mark corresponding to the first substrate alignment mark, and a second alignment substrate alignment mark corresponding to the second substrate alignment mark.

The processor 21 is further configured to capture positions of the first substrate alignment mark and the second alignment substrate alignment mark by the image acquisition device; establish a coordinate system on a plane where the first alignment substrate alignment mark and the second alignment substrate alignment mark are located; and calculate first coordinates of the first alignment substrate alignment mark in the coordinate system and second coordinates of the second alignment substrate alignment mark in the coordinate system.

The calculator 22 is further configured to capture the first substrate alignment mark and the second substrate alignment mark on the substrate by the image acquisition device, and determine third coordinates of the first substrate alignment mark in the coordinate system and fourth coordinates of the second substrate alignment mark in the coordinate system.

The aligner 23 is further configured to align the substrate with the alignment substrate according to the first coordinates, the second coordinates, the third coordinates and the fourth coordinates.

Further, the aligner 23 includes:

a rotator configured to rotate the substrate so that $(Y1-Y5)=(Y2-Y6)$;

a first mover configured to move the substrate in the Y-axis direction by a distance of $(Y1-Y5)$ so that $(Y1-Y5)=(Y2-Y6)=0$;

a second mover configured to move the substrate in the X-axis direction by a distance of $(X1+X2-X5-X6)/2$, where, according to different values of X1, X2, X5 and X6, a calculation result of $(X1+X2-X5-X6)/2$ may be a positive value or a negative value. When the calculation result of $(X1+X2-X5-X6)/2$ is a positive value, the substrate is moved towards the positive direction of the X axis by a distance of an absolute value of $(X1+X2-X5-X6)/2$. When the calculation result of $(X1+X2-X5-X6)/2$ is a negative value, the substrate is moved towards the negative direction of the X axis by a distance of an absolute value of $(X1+X2-X5-X6)/2$.

The first coordinates are (X5, Y5), the second coordinates are (X6, Y6), the third coordinates are (X1, Y1), and the fourth coordinates are (X2, Y2).

One embodiment of the present disclosure further provides an alignment device, including: a memory, a processor and a computer program stored on the memory and executable on the processor. The computer program is executed by the processor to implement steps of the above alignment method.

One embodiment of the present disclosure further provides a computer readable storage medium. The computer readable storage medium stores a computer program. The computer program is executed by a processor to implement steps of the above alignment method, or, the computer program is executed by the processor to implement steps of the above electrical detection method.

It should be understood that, these embodiments described in the application may be implemented by hardware, software, firmware, middleware, microcode, or a combination thereof. For hardware implementation, a processing unit may be implemented in one or more Application Specific Integrated Circuits (ASICs), Digital Signal Processing (DSPs), DSP Device (DSPDs), Programmable Logic Devices (PLDs), Field-Programmable Gate Array (FPGAs), general processors, controllers, microcontrollers, microprocessors, another electronic unit or a combination thereof, which is configured to implement the functions of the application.

For software implementation, techniques described in the application may be implemented, by executing modules (e.g., process, function, etc.) with corresponding functions in the application. Software codes may be stored in the memory, and executed by the processor. The memory may be implemented in the processor, or external to the processor.

The various embodiments in the present specification are described in a progressive manner, and each embodiment focuses on differences from other embodiments, and the same similar parts between the various embodiments can be referred to each other.

Those skilled in the art will appreciate that embodiments of the present disclosure can be provided as a method, an apparatus, or a computer program product. Thus, embodiments of the present disclosure may take the form of an entire hardware embodiment, an entire software embodiment, or a combination of software and hardware. Moreover, the embodiments of the present disclosure may take the form of a computer program product embodied on one or more computer-usable storage media (including but not limited to a disk storage, CD-ROM, an optical storage, etc.) including computer usable program code.

The present disclosure has been described with reference to the flow charts and/or block diagrams of the method, device (system) and computer program product according to the embodiments of the present disclosure. It should be understood that computer program instructions may be used to implement each of the work flows and/or blocks in the flow charts and/or the block diagrams, and the combination of the work flows and/or blocks in the flow charts and/or the block diagrams. These computer program instructions may be provided to a processor of a common computer, a dedicate computer, an embedded processor or any other programmable data processing devices to create a machine, so that instructions executable by the processor of the computer or the other programmable data processing devices may create a device to achieve the functions assigned in one or more work flows in the flow chart and/or one or more blocks in the block diagram.

These computer program instructions may also be stored in a computer readable storage that may guide the computer or the other programmable data process devices to function in a certain way, so that the instructions stored in the computer readable storage may create a product including an instruction unit which achieves the functions assigned in one or more flows in the flow chart and/or one or more blocks in the block diagram.

These computer program instructions may also be loaded in the computer or the other programmable data process devices, so that a series of operation steps are executed on the computer or the other programmable devices to create processes achieved by the computer. Therefore, the instructions executed in the computer or the other programmable devices provide the steps for achieving the function assigned in one or more flows in the flow chart and/or one or more blocks in the block diagram.

The above are merely the preferred embodiments of the present disclosure and shall not be used to limit the scope of the present disclosure. It should be noted that, a person skilled in the art may make improvements and modifications without departing from the principle of the present disclosure, and these improvements and modifications shall also fall within the scope of the present disclosure.

It should also be noted that in this application, relational terms such as first and second are merely used to differentiate different components rather than to represent any order, number or importance. Further, the term "including", "include" or any variants thereof is intended to cover a non-exclusive contain, so that a process, a method, an article or a user equipment, which includes a series of elements, includes not only those elements, but also includes other elements which are not explicitly listed, or elements inherent in such a process, method, article or user equipment. In absence of any further restrictions, an element defined by the phrase "including one . . . " does not exclude the existence of additional identical elements in a process, method, article, or user equipment that includes the element.

The above are merely the preferred embodiments of the present disclosure. It should be noted that, a person skilled in the art may make improvements and modifications without departing from the principle of the present disclosure, and these improvements and modifications shall also fall within the scope of the present disclosure.

What is claimed is:

1. An alignment method for aligning a substrate with an alignment substrate, the alignment method comprising:
capturing alignment marks of the alignment substrate by an image acquisition device and establishing a coordinate system on a plane where at least two alignment marks of the alignment substrate are located;
capturing an alignment mark and/or an auxiliary alignment mark of the substrate by the image acquisition device and determining coordinates of the alignment mark of the substrate in the coordinate system;
aligning the substrate with the alignment substrate according to the coordinates,
wherein the alignment mark of the substrate includes a first substrate alignment mark and a second substrate alignment mark, the first substrate alignment mark and the second substrate alignment mark are axisymmetric with respect to a center line of a wiring area of the substrate; the alignment mark of the alignment substrate includes a first alignment substrate alignment mark corresponding to the first substrate alignment mark, and a second alignment substrate alignment mark corresponding to the second substrate alignment mark;

wherein the establishing a coordinate system on a plane where at least two alignment marks of the alignment substrate are located, includes: establishing the coordinate system on a plane where the first alignment substrate alignment mark and the second alignment substrate alignment mark are located, and calculating first coordinates of the first alignment substrate alignment mark in the coordinate system and second coordinates of the second alignment substrate alignment mark in the coordinate system;

wherein the determining coordinates of the alignment mark of the substrate in the coordinate system, includes: determining third coordinates of the first substrate alignment mark in the coordinate system and fourth coordinates of the second substrate alignment mark in the coordinate system;

wherein the aligning the substrate with the alignment substrate according to coordinates, includes: aligning the substrate with the alignment substrate according to the first coordinates, the second coordinates, the third coordinates and the fourth coordinates.

2. The alignment method according to claim 1, wherein the alignment substrate further includes an auxiliary alignment mark having a shape different from a shape of the alignment marks of the alignment substrate; the capturing alignment marks of the alignment substrate by an image acquisition device, includes:

capturing the alignment marks of the alignment substrate by the image acquisition device;

when capturing fails, capturing the auxiliary alignment mark of the alignment substrate by the image acquisition device, and determining positions of the alignment marks of the alignment substrate according to positional relationship between the auxiliary alignment mark of the alignment substrate and the alignment marks of the alignment substrate.

3. The alignment method according to claim 1, wherein the alignment substrate further includes an auxiliary alignment mark having a shape different from a shape of the alignment marks of the alignment substrate; the capturing alignment marks of the alignment substrate by an image acquisition device, includes:

capturing at least two alignment marks of the alignment substrate by the image acquisition device;

determining whether the captured at least two alignment marks of the alignment substrate meet a preset positional relationship between the at least two alignment marks of the alignment substrate;

when the captured at least two alignment marks of the alignment substrate do not meet the preset positional relationship between the at least two alignment marks of the alignment substrate, capturing the auxiliary alignment mark of the alignment substrate by the image acquisition device, and determining positions of the alignment marks of the alignment substrate according to positional relationship between the auxiliary alignment mark of the alignment substrate and the alignment marks of the alignment substrate.

4. The alignment method according to claim 1, wherein the capturing an alignment mark and/or an auxiliary alignment mark of the substrate by the image acquisition device and determining coordinates of the alignment mark of the substrate in the coordinate system, includes:

capturing the alignment mark of the substrate by the image acquisition device;

when capturing fails, capturing at least two of the auxiliary alignment mark of the substrate and other alignment marks of the substrate by the image acquisition device, and determining the coordinates of the alignment mark of the substrate in the coordinate system according to positional relationship between the alignment mark of the substrate and the at least two of the auxiliary alignment mark of the substrate and other alignment marks of the substrate.

5. The alignment method according to claim 1, wherein the capturing an alignment mark and/or an auxiliary alignment mark of the substrate by the image acquisition device and determining coordinates of the alignment mark of the substrate in the coordinate system, includes:

capturing at least two alignment marks of the substrate by the image acquisition device;

determining whether the captured at least two alignment marks of the substrate meet a preset positional relationship between the at least two alignment marks of the substrate;

when the captured at least two alignment marks of the substrate do not meet a preset positional relationship between the at least two alignment marks of the substrate, capturing the auxiliary alignment mark of the substrate by the image acquisition device, and determining the coordinates of the alignment mark of the substrate in the coordinate system according to positional relationship between the alignment mark of the substrate and at least two of the auxiliary alignment mark of the substrate and captured alignment marks of the substrate.

6. The alignment method according to claim 1, wherein the aligning the substrate with the alignment substrate according to the first coordinates, the second coordinates, the third coordinates and the fourth coordinates, includes:

rotating the substrate so that $(Y1-Y5)=(Y2-Y6)$;

moving the substrate in a Y-axis direction by a distance of $(Y1-Y5)$ so that $(Y1-Y5)=(Y2-Y6)=0$;

moving the substrate in an X-axis direction by a distance of $(X1+X2-X5-X6)/2$; wherein, when a calculation result of $(X1+X2-X5-X6)/2$ is a positive value, the substrate is moved towards a positive direction of the X axis by a distance of an absolute value of $(X1+X2-X5-X6)/2$; when the calculation result of $(X1+X2-X5-X6)/2$ is a negative value, the substrate is moved towards a negative direction of the X axis by a distance of an absolute value of $(X1+X2-X5-X6)/2$;

wherein the first coordinates are $(X5, Y5)$, the second coordinates are $(X6, Y6)$, the third coordinates are $(X1, Y1)$, and the fourth coordinates are $(X2, Y2)$.

7. An alignment device comprising:

a processor configured to capture alignment marks of an alignment substrate by an image acquisition device and establish a coordinate system on a plane where at least two alignment marks of the alignment substrate are located;

a calculator configured to capture an alignment mark and/or an auxiliary alignment mark of a substrate by the image acquisition device, and determine coordinates of the alignment mark of the substrate in the coordinate system;

an aligner configured to align the substrate with the alignment substrate according to the coordinates.

8. An alignment device comprising: a memory, a processor, and a computer program stored on the memory and executable on the processor; wherein the computer program is executed by the processor to implement steps of the alignment method according to claim 1.

\* \* \* \* \*